US011100595B2

(12) United States Patent
Schweitzer, III et al.

(10) Patent No.: US 11,100,595 B2
(45) Date of Patent: Aug. 24, 2021

(54) ELECTRIC POWER SYSTEM PRICING WITH ENERGY PACKETS

(71) Applicant: Schweitzer Engineering Laboratories, Inc., Pullman, WA (US)

(72) Inventors: Edmund O. Schweitzer, III, Pullman, WA (US); David E. Whitehead, Pullman, WA (US); Gregory C. Zweigle, Pullman, WA (US); Dallas J. Jacobsen, Bothell, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 133 days.

(21) Appl. No.: 16/589,731

(22) Filed: Oct. 1, 2019

(65) Prior Publication Data

US 2020/0111176 A1    Apr. 9, 2020

Related U.S. Application Data

(60) Provisional application No. 62/740,503, filed on Oct. 3, 2018.

(51) Int. Cl.
| | |
|---|---|
| *G06Q 50/06* | (2012.01) |
| *G06Q 30/02* | (2012.01) |
| *G01R 21/00* | (2006.01) |
| *H02J 3/00* | (2006.01) |
| *G01D 4/00* | (2006.01) |
| *G01R 21/06* | (2006.01) |

(52) U.S. Cl.
CPC .............. *G06Q 50/06* (2013.01); *G01D 4/00* (2013.01); *G01R 21/00* (2013.01); *G01R 21/06* (2013.01); *G06Q 30/0283* (2013.01); *H02J 3/00* (2013.01)

(58) Field of Classification Search
CPC ...... G06Q 50/06; G06Q 30/0283; G01D 4/00; G01R 21/00; G01R 21/06; H02J 3/00
See application file for complete search history.

(56) References Cited

U.S. PATENT DOCUMENTS

| | | | | |
|---|---|---|---|---|
| 6,732,052 | B2 * | 5/2004 | Macdonald | ........... E21B 44/005 |
| | | | | 702/6 |
| 8,068,937 | B2 | 11/2011 | Eaves | |
| 9,184,795 | B2 | 11/2015 | Eaves | |
| 9,853,689 | B2 | 12/2017 | Eaves | |
| 2009/0234512 | A1 * | 9/2009 | Ewing | ..................... H04L 12/10 |
| | | | | 700/295 |

OTHER PUBLICATIONS

Google_Search_Results, Apr. 8, 2021, 2 pp. (Year: 2021).*

(Continued)

*Primary Examiner* — Toan M Le
*Assistant Examiner* — Xiuqin Sun
(74) *Attorney, Agent, or Firm* — Richard M. Edge (57) ABSTRACT

Calculation of a value of energy passing a point of an electric power delivery system, and price associated with the value is disclosed herein. Use of energy packets according with the embodiments of this disclosure more accurately represents the amount of energy produced and consumed by equipment. Energy packets may be calculated over one or more phases, over configurable time periods. Energy packets may be used in conjunction with a monetary rate to calculate the price for billing an energy consumer or crediting an energy producer.

20 Claims, 6 Drawing Sheets

(56) References Cited

OTHER PUBLICATIONS

NPL Search Results, Apr. 8, 2021, 2 pp. (year: 2021).*
NPL_731_1 Search Results, Jul. 9, 2021, 1 pp. (year: 2021).*
Elif Uysal-Biyikoglu, et. al "Energy-Efficient Packet Transmission Over a Wireless Link", IEEE/ACM Transactions on Networking, vol. 10, No. 4, Aug. 2002.
Erol Gelenbe, et. al "Central or Distributed Energy Storage for Processors with Energy Harvesting", 2015 Sustainable Internet and ICT for Sustainability (SustainIT), IEEE, Apr. 2015.
Erol Gelenbe and Elif Tugce Ceran "Energy Packet Networks with Energy Harvesting", IEEE Access, vol. 4, Mar. 2016.
A. Monti, et. al "Towards a Real Digital Power System An Energy Packet Approach", 2017 IEEE Conference on Energy Internet and Energy System Integration (E12), Nov. 2017.
Roberto Rojas-Cessa, et. al "An Energy Packet Switch for Digital Power Grids", 2018 IEEE International Conference on Internet of Things (iThings) and IEEE Green Computing and Communications (GreenCom) and IEEE Cyber, Physical and Social Computing (CPSCom) and IEEE Smart Data (SmartData), Jul. 2018.
Ivan Smon, et al "Local Voltage-Stability Index Using Tellegen's Theorem", IEEE Transactions on Power Systems, vol. 21. No. 3, Aug. 2006.
PCT/US2019/054180 Patent Cooperation Treaty, International Search Report and Written Opinion of the International Searching Authority, dated Jan. 2, 2020.
Engineering Institute of Technology "Fundamentals of Smart Metering—kWh and kVArh Meters" Article [online], Jul. 13, 2017 [retrieved Dec. 3, 2019]. Retrieved from <URL:https:www.eit.edu.au/cms/resources/technical-resourses/fundamentals-of-smater-metering-kwh-and-kvarh-meters-2>.
Schneider Electric "PowerLogic—™ PM5100 Series Power and Energy Meter" User Manual [online], Mar. 2017 [retrieved Dec. 4, 2019]. Retrieved from <URL: https://download.schneider-electric.com/files?p_enDocType=User+guide&p_File_Name=EAV15105-EN05.pdf&p_Doc_Ref=EAV15105-EN>.
Yokogawa "How to Measure Electrical Power" Article [online]. 2017 [retrieved Dec. 4, 2019]. Retrieved from <URL:https://tmi.yokogawa.com/us/library/resources/application-notes/how-to-measure-electrical-power/>.

* cited by examiner

ELECTRIC POWER SYSTEM PRICING WITH ENERGY PACKETS

RELATED APPLICATION

This application claims priority under 35 U.S.C. § 119 to U.S. Provisional Patent Application No. 62/740,503 filed on 3 Oct. 2018, titled "Electric Power System Pricing with Energy Packets" and naming Edmund O. Schweitzer III, David E. Whitehead, Gregary C. Zweigle, and Dallas Jacobsen as inventors, which application is hereby incorporated by reference in its entirety.

TECHNICAL FIELD

This disclosure relates to calculating energy passing through a point of an electric power system using energy packets. This disclosure further relates to calculating a value of energy passing through a point of an electric power delivery system using energy packets.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems have been designed for the safe and reliable generation, transmission, and distribution of electric power to consuming loads. Electric power markets transact electricity, which is the medium that transfers energy from generators to consumers (via the electric power delivery system). In order to measure the amount of energy generated and delivered to consumers, IEDs that perform metering functions may be used. Traditionally, metering techniques measured energy delivered based on time averages. Although time averages were acceptable for traditional energy generation and long intervals, the do not adequately measure the delivery of energy under many circumstances such as, for example, when AC power exhibits a non-pure sinusoidal waveform; trading intervals are shortened, renewable energy generation with fast dynamics are present; more distributed generation is used; and the like. What is needed is an accurate method of measuring energy delivered to loads even under conditions of modern electric power delivery systems.

Described herein are systems and methods that use energy packets to measure energy through a point on the electric power delivery system. For the purposes of this document, such a point could be thought of as an infinitely small slice of a conductor at which voltage at, and current though, that slice can be measured. In some embodiments, a point may be considered to be a location at which a piece of power apparatus (e.g., machine, line, transformer) connects to a bus. The point does not store, product, nor consume energy. The point may include, but does not require, the presence of current (CT) or voltage (PT) measurement apparatus (e.g. current transducers (CTs) potential transducers (PTs) or the like). If measurement apparatus are collocated with a point, it may be alternatively referred to as a measurement point or point of metering. For practical application, CTs and PTs cannot typically be collocated at a point. As such, the measurement point is typically the location of the CT and the voltage is considered collocated as long as minimal impedance exists between the location of the PT and CT. The disclosures herein divide the energy at each point of measurement into the portion that transfers away from the point and the portion that transfers to the point. Energy packets may be used to calculate a monetary value of energy delivered, and a price to charge (or value to reimburse) for the energy delivered.

The embodiments of this disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks or computer instructions. Software modules or components may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment.

Figure 1A:
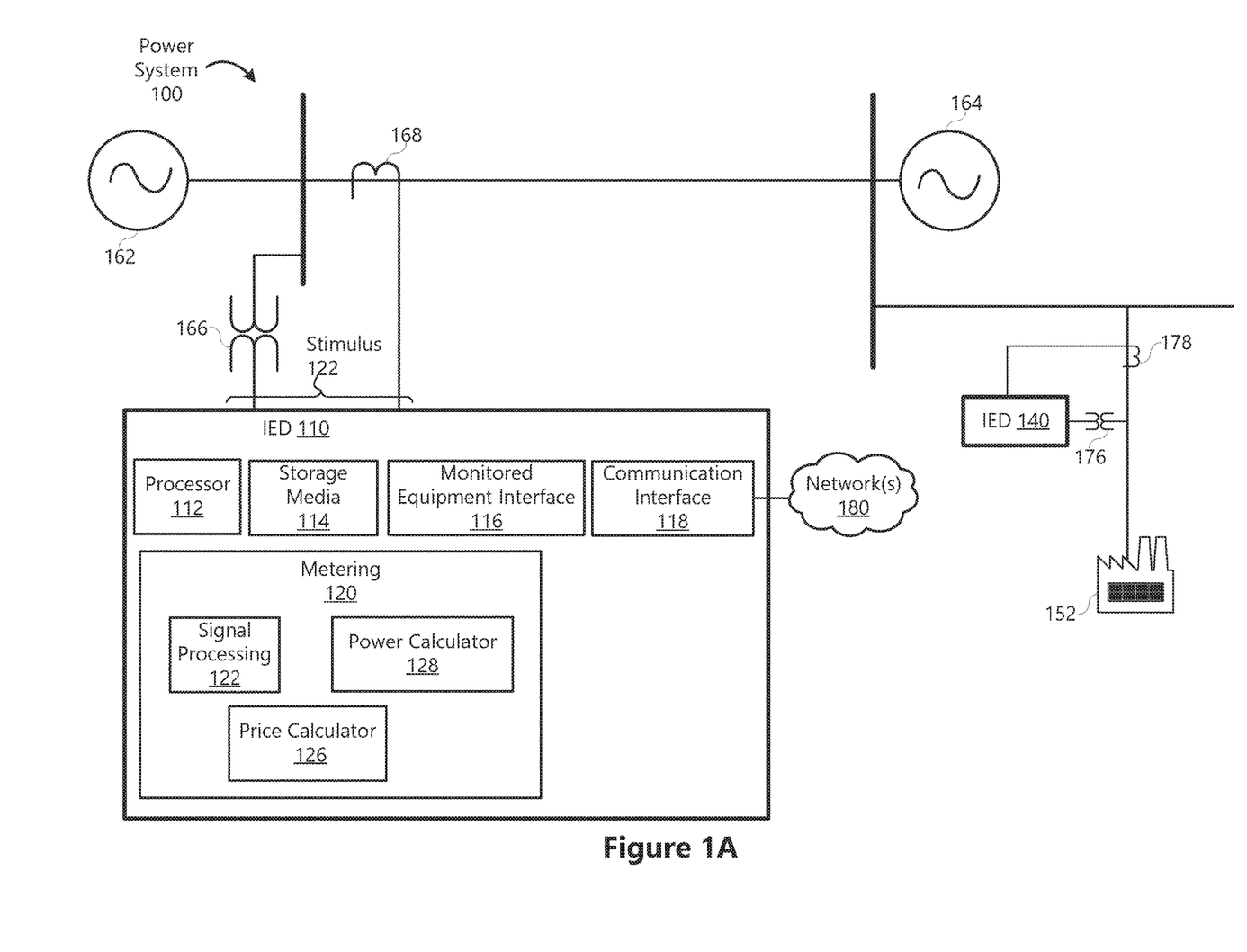
FIG. 1A illustrates a one-line diagram of an electric power delivery system including intelligent electronic devices (IEDs) for metering portions of the electric power delivery system.

FIG. 1 illustrates a simplified one-line diagram of an electric power delivery system (generation, transmission, distribution, and consumption) 100 that includes intelligent electronic devices (IEDs) 110, 140 configured to meter electricity through respective points of the electric power delivery system. The electric power delivery system 100 comprises various equipment such as generation 162, 164 (one or more electric power generators), buses, transmission lines, transformers, circuit breakers, distribution lines, and the like for generating, transmitting, and delivering energy to a load such as consumer 152. IEDs 110, 140 may obtain power system signals from portions of the electric power delivery system either directly (as illustrated) or indirectly from various devices such as merging units. Electric power system signals may be obtained using instrument transformers such as current transformers (CTs) 168, 178, potential transformers (PTs) 166, 176, and the like. IEDs 110, 140 may use power system signals such as signals representing current and voltage to determine energy transferred through equipment of the electric power delivery system.

IEDs 110 and 140 may be any device configured to meter electric power. IED 110 may include a stimulus input 122 configured to receive CT and PT secondaries and condition the signals received therefrom for use by the IED 110. Signal conditioning may include various filters, step-down transformers, analog-to-digital converters (A/D) and the like to produce digitized analog signals. In various embodiments, digitized analog signals may be provided by other devices such as merging units. IED 110 may include a processor 112 for executing instructions. The processor 112 may be implemented as a field-programmable gate array (FPGA), microprocessor, application specific integrated circuit, or the like. Storage media 114 may be a repository for computer instructions executed by the processor 112, settings, samples, and the like. Storage media 114 may include a single or multiple physical storage media, one or more of which may be packaged with the processor 112. A monitored equipment interface 116 may be in communication with monitored equipment of the electric power delivery system such as a circuit breaker for sending signals to the equipment and receiving status signals from the equipment. A communication interface 118 may facilitate communications with various other devices either directly or, as illustrated, via a network 180.

As discussed briefly above, electric power markets transact electricity. Electricity is the medium that transfers energy from generators to consumers. Consumers desire energy delivered over specific intervals of time. To calculate the flow of energy, IED 110 may also include metering 120, which may be embodied as computer instructions on storage media 114 for execution by processor. Metering 120 may include further signal processing 122 to condition obtained currents and voltages. A power calculator 128 may calculate power at the point monitored by IED 110, which may be used to calculate energy transferred through the point. For example, the price calculator 126 may determine a value of electrical energy transmitted (or price to bill or compensate) by multiplying a price by the energy received over an interval of time. The energy received is computed based on time-averaged power passing through a specified point. The time-averaged power p(t) may be calculated in a power calculator 128 from electric voltage v(t) and current i(t) measurements as illustrated in Equation 1:

$$p(t)=v(t)i(t) \qquad \text{Eq. 1}$$

Under typical operating conditions, voltage and current may be modeled as sinusoidal steady-state values, with frequency ω and phase difference as illustrated in Equations 2 and 3:

$$v(t)=V\cos(\omega t) \qquad \text{Eq. 2}$$

$$i(t)=I\cos(\omega t-\phi) \qquad \text{Eq. 3}$$

Substituting Equations 2 and 3 into Equation 1, and applying a trigonometric identity yields Equation 4:

$$p(t)=\tfrac{1}{2}VI[\cos(\phi)(1+\cos(2\omega t))+\sin(\phi)\sin(2\omega t)] \qquad \text{Eq. 4}$$

Figure 1B:
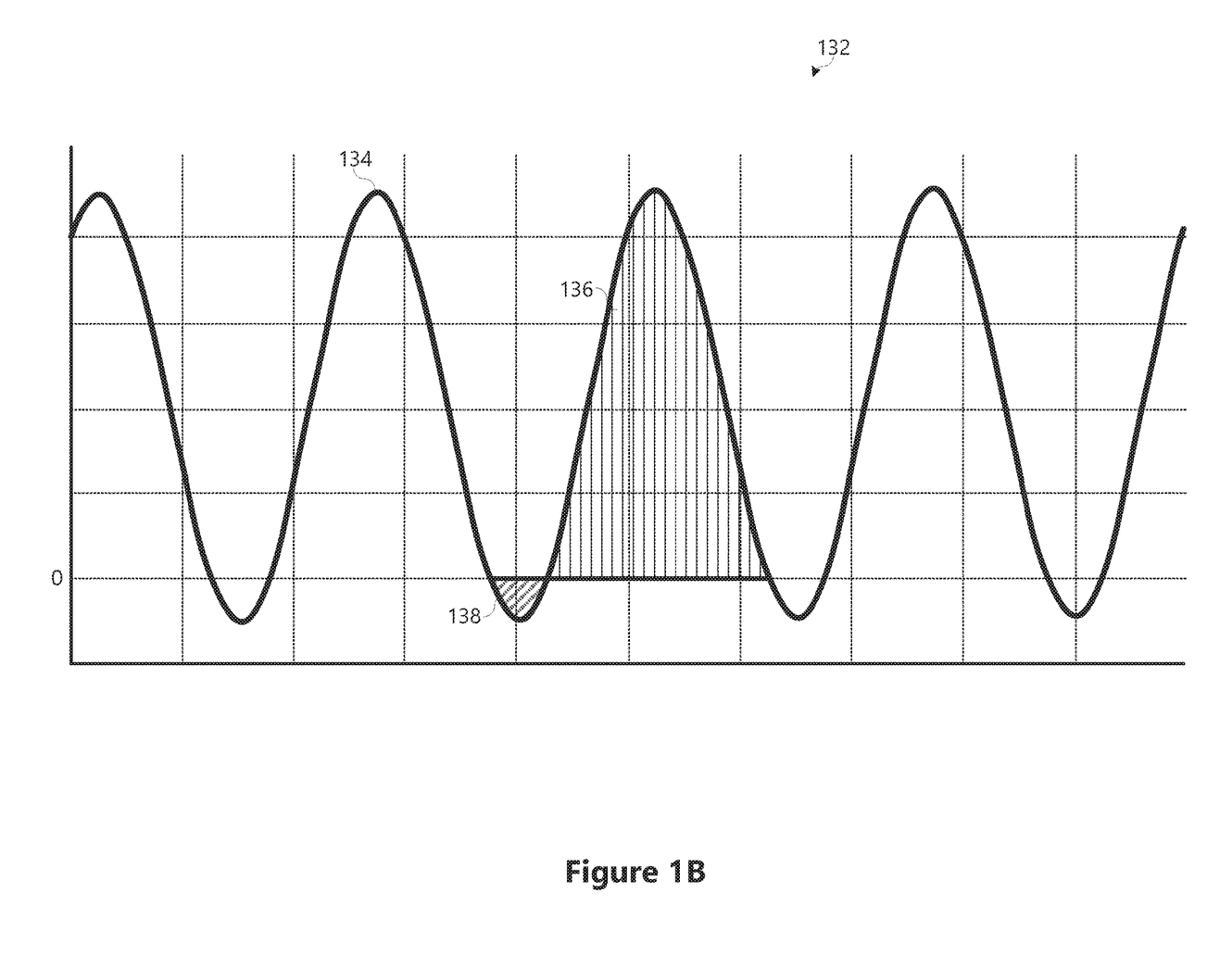
FIG. 1B illustrates a plot of electric power over time.

FIG. 1B illustrates an example plot 132 of electric power 134 (Equation 4) vs. time. The sign (positive or negative) of an energy packet as it moves through a measuring point may be assigned by convention, and calculated by the measuring device using a setting corresponding with the convention. In the illustrated embodiments, when an energy packet is positive, it represents a measurement of energy moving through the place where energy is being measured and away from a piece of equipment; and when an energy packet is negative, it represents a measurement of energy moving through the place where energy is being measured and toward a piece of equipment. During region 138 the sign of power flow is negative, meaning that power is flowing in the opposite direction to the CTs configured polarity. For a CT that is configured to measure a positive value for energy leaving a specific device, this then indicates that at the measuring point energy is entering during the measured time interval. During region 136 the power is positive. This indicates that at the measuring point energy is leaving during the measured time interval.

Financial compensation to a generator is for energy delivered to the grid when required in a specific time interval. Therefore, energy markets commonly apply time-averaged power as an input when computing financial transactions. From time-averaged power, the energy is computed by integration. Time-averaged power may be computed by multiplying voltage and current to produce power p(t) followed by integration over an interval that is an exact multiple N of the instantaneous power system fundamental frequency $f_o$ as illustrated in Equation 5:

$$P_{avg} = \frac{f_o}{N}\int_0^{\frac{N}{f_o}} p(t)dt \qquad \text{Eq. 5}$$

Substitute Equation 4 into Equation 5 yields Equation 6:

$$P_{avg}=\tfrac{1}{2}VI\cos(\phi) \qquad \text{Eq. 6}$$

Define an additional term called reactive power Q shown in Equation 7:

$$Q=\tfrac{1}{2}VI\sin(\phi) \qquad \text{Eq. 7}$$

Reactive power provides a quantity that relates to the need for exchanging energy with passive inductances and capacitances in the system. Because of this property, reactive power is an available quantity for measuring value in ancillary service markets.

Time-average power $P_{avg}$ (Equation 6) is useful for some electricity markets where loads require energy in a manner that averages over time. For example, heating occurs in an averaged manner and over long-time intervals. Time-average power is also useful in markets for simplicity of market trading with averaged quantities that change slowly. Finally, these quantities lead to mathematically tractable approaches for measuring the flow of power through a complex electric grid.

Although time-averaged power and reactive power may be successfully applied for some electric power markets, certain changes to the former power systems are motivating innovative approaches. For example, power system dynamics are becoming faster, driven by increases in renewable generation, decreases in system inertia, and high density of power-electronically coupled devices. Averaging techniques do not provide pricing signals for these dynamics on the same time-scale as their transient response times. Furthermore, when voltage and current signals are not pure sinusoids, averaging techniques based on the power system frequency do not adequately measure non-sinusoidal properties. Therefore, averaging techniques do not provide accurate pricing in these cases. Simple reactive power calculations (Equation 7) become less related to physical phenomena for non-sinusoidal waveforms. As energy trading markets transact on shorter intervals, the averaged quantities based on frequency do not scale past a certain minimum trading time-interval.

In addition, it is difficult to time-align average power quantities because the integration interval (Equation 5) is frequency dependent and the frequency is not steady or uniform across the power system during non-steady-state dynamics. For example, energy is communicated using KY and KYZ pulses. The period of these pulses is a reciprocal function of the rate of energy that passes through a measuring point. Because of this, the pulses vary in duration and are not time aligned.

Further still, the addition of energy storage devices and distributed energy sources are necessitating alternative methods to properly value energy exchanges. A unit for transactions is needed that better represents both traditional power generation and the fast dynamics of renewable energy generation.

Figure 2:
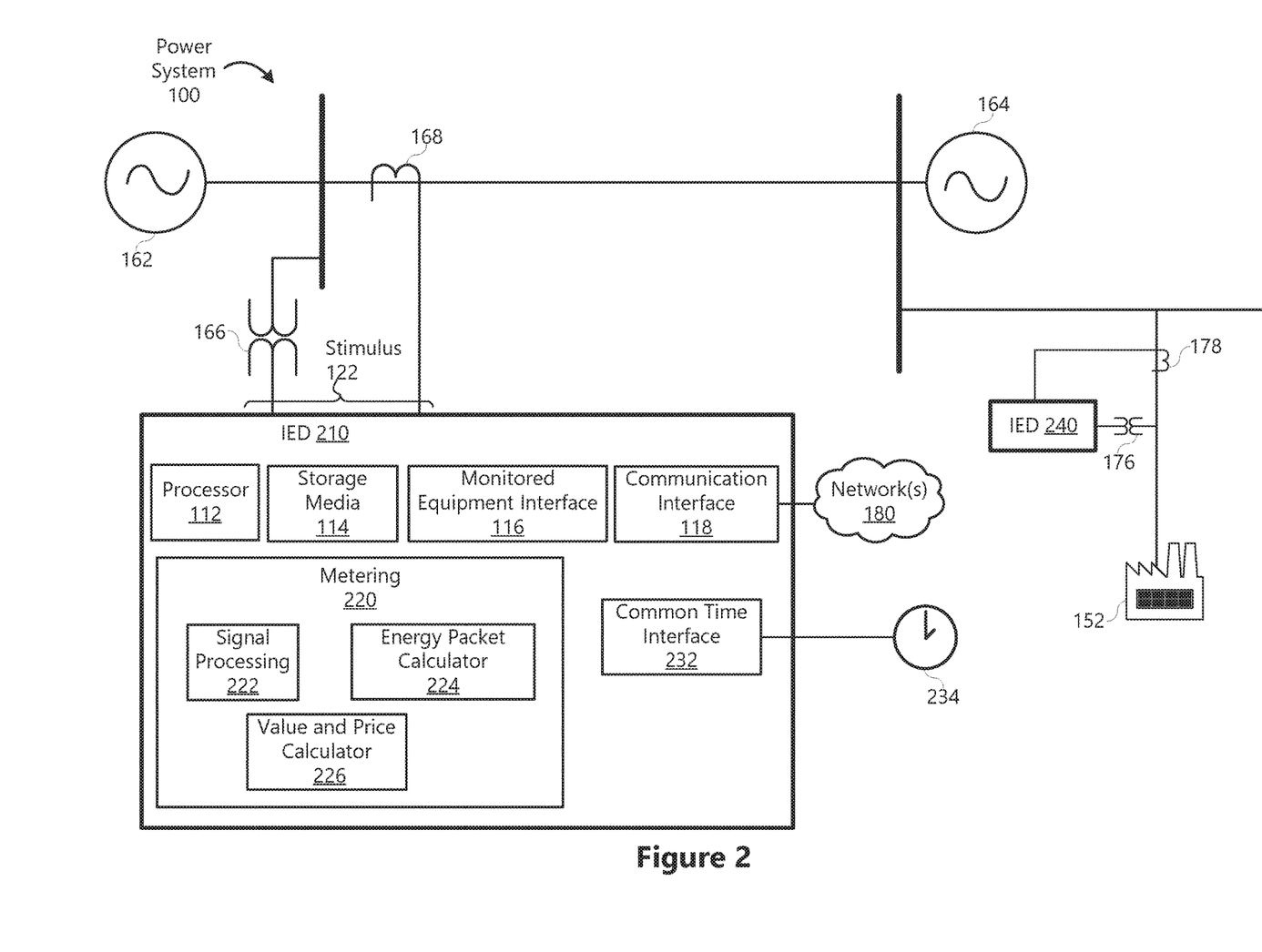
FIG. 2 illustrates a one-line diagram of an electric power delivery system including IEDs for metering portions of the electric power delivery system using energy packets in accordance with several embodiments herein.

The disclosures outlined herein take a new fundamental approach to electric power markets based on measuring fixed-width and time-synchronized packets of energy. FIG. 2 illustrates an electric power delivery system similar to that of FIG. 1A, however the IEDs 210, 240 of FIG. 2 measure energy transfer in the form of energy packets. Indeed, metering 220 includes signal processing 222 for conditioning signals for use in calculation of energy packets. The value and price calculator 226 calculates a value or price of electric energy flowing past the IED 210 by multiplying the calculated energy packets by a price rate or value rate. Energy packet calculator 224 may calculate energy packets flowing through the point monitored by IED 210 using principles detailed below. In various embodiments, calculation and/or communication of energy packets uses a common time signal that may be obtained by the IED using a common time interface 232 in communication with a common time source 234. Common time signal may be any time signal that from a time source 234 that is common to the devices on the electric power delivery system. Common time source 234 may include a global navigation satellite system (GNSS), WWVB, or other similar common time. Common time signal may be delivered via radio or over other communication media using a common protocol such as IRIG. In various embodiments, the common time signal may be received via the communication interface 232. The common time signal may be a common network time.

Energy packet signs may be determined for consistency among devices on the system. For example, the sign of an energy packet may be positive when energy moves away from a location in the electric power system, and negative when energy moves toward a location. Positive valued transmission of energy includes both that which ultimately drives a load as well as energy returned to the system from temporary storage in a passive reactive element. Negative transmission of energy (therefore, the reception of energy) includes both energy applied to a load as well as that which temporarily stores in a passive reactive element.

One of the advantages of the embodiments presently disclosed is treating storage devices uniformly with all devices that exchange energy with the system without adding energy to the system. Accordingly, energy packets may be used to independently price energy put into the system and energy taken from the system. The valuing of energy exchanged at each point in the electric power system is precise using the embodiments described herein.

As described below, the disclosures hereof are fundamentally different than a time-averaged power $P_{avg}$ and a reactive power Q combination. In the time-averaged methods, the mathematics attempts to separate power driving loads and power circulating in a lossless manner among passive reactive power devices. However, physical interpretation of reactive power is challenging in all cases except the pure steady-state sinusoidal case. Energy packets provide a simpler approach. The disclosures herein provide a method that divides the energy at each point into the portion that transfers away from a point and the portion that transfers to a point (or energy entering the point and energy leaving the point). This simplifies accounting for energy exchanges in today's electric power system characterized by fast dynamics, non-sinusoidal signals, and power-electronically coupled devices.

Equation 8 defines the continuous-time energy packet $\varepsilon(t)$ from voltages $v(\sigma)$ and currents $i(\sigma)$:

$$\varepsilon(t) = \int_{t-T}^{t} v(\sigma)i(\sigma)d\sigma \qquad \text{Eq. 8}$$

Equation 9 defines the three-phase energy packet $\varepsilon_3(t)$. In Equation 9, the integration interval is over the same time interval for all three phases. This equation includes the possibility of unbalanced three-phase operation. For three-phase applications, it is also possible to apply a transformation prior to integration. For example, representing the signal as Clarke components.

$$\varepsilon_3(t) = \int_{t-T}^{t} \left[ v_{a\text{-}phase}(\sigma)i_{a\text{-}phase}(\sigma) + v_{b\text{-}phase}(\sigma)i_{b\text{-}phase}(\sigma) + v_{c\text{-}phase}(\sigma)i_{c\text{-}phase}(\sigma) \right] d\sigma \qquad \text{Eq. 9}$$

Equation 10 defines the discrete-time energy packet $\varepsilon[n]$, where it is appreciated that the product of the voltage (e.g. in J/c) and current (e.g. in c/s) is power (e.g. in J/s). The value $T_S$ is the data sample period, and M represents the number of samples within the period:

$$\varepsilon[n] = MT_S \sum_{m=n-M+1}^{n} v[m]i[m] \qquad \text{Eq. 10}$$

The notation for a discrete-time quantity is with hard brackets: $v[m] \equiv v(mT_S)$. Equation 11 defines the discrete-time, three-phase energy packet:

$$\varepsilon_3(n) = MT_s \sum_{m=n-M+1}^{n} v_{a\text{-}phase}[m]i_{a\text{-}phase}[m] + v_{b\text{-}phase}[m]i_{b\text{-}phase}[m] + v_{c\text{-}phase}[m]i_{c\text{-}phase}[m] \qquad \text{Eq. 11}$$

Equations 8-11 place no constraint on the values of T or $T_S$. Thus, energy packets are frequency independent.

Figure 3:
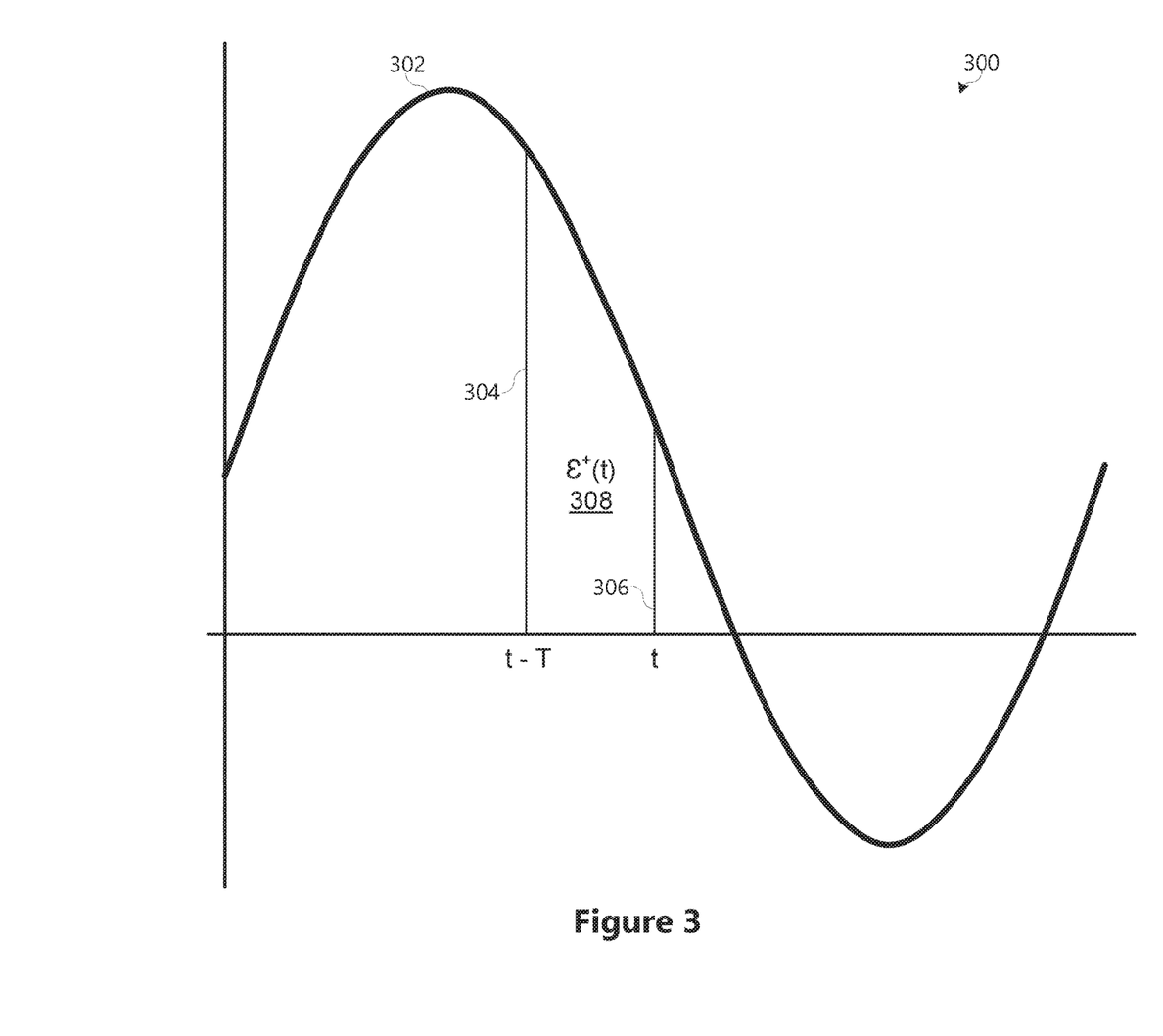
FIG. 3 illustrates a plot of a product of voltage and current over time including an energy packet interval.

Positive and negative direction energy may be calculated over each integration interval. FIG. 3 illustrates a plot 300 of an instantaneous product of voltage and current 302 over time. A positive energy packet 308 is bounded at times 304 and 306. The positive energy packet 308 is calculated for the continuous-time case. The integration interval (Equation 8) covers from the present time t and then back T seconds to the previous time t−T. In FIG. 3, the energy is represented with a superscript $\varepsilon^+$ to indicate that only positive power contributed to the energy in this interval T.

Figure 4:
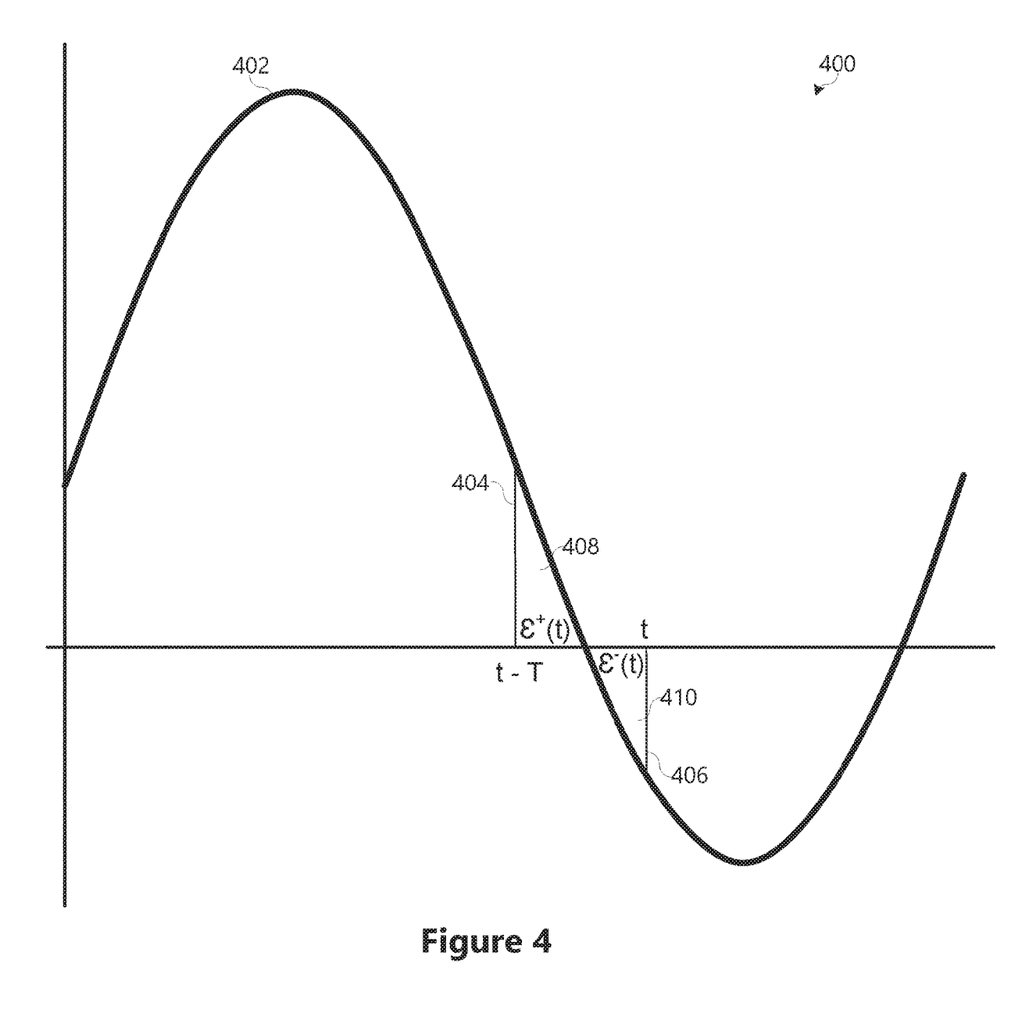
FIG. 4 illustrates another plot of a product of voltage and current over time including an energy packet interval.

FIG. 4 illustrates a plot 400 of an instantaneous product of voltage and current 402 over time, where the integration interval from 404 (at time t−T) to 406 (at time t) includes power in both directions. In this case two separate intervals are computed, one for energy flowing in the positive direction $\varepsilon^+$ and one for energy flowing in the opposite, or, negative, direction, $\varepsilon^-$. This algorithm easily extends to an arbitrary number of zero crossings over the integration interval. In various embodiments, the total of all power flowing in the positive direction may be combined for energy packet $\varepsilon^+$ and the total of all power flowing in the negative direction may be combined for energy packet $\varepsilon^-$. Both packets may be reported for the same time instant t and for the same interval t–T.

The separation into positive and negative regions is given mathematically as follows in Equations 12 and 13, for the discrete-time case:

$$\varepsilon^+[n] = MT_s \sum_{m=n-M+1}^{n} \begin{cases} v[m]i[m] & \text{if: } v[m]i[m] \geq 0 \\ 0 & \text{otherwise} \end{cases} \quad \text{Eq. 12}$$

$$\varepsilon^-[n] = MT_s \sum_{m=n-M+1}^{n} \begin{cases} v[m]i[m] & \text{if: } v[m]i[m] < 0 \\ 0 & \text{otherwise} \end{cases} \quad \text{Eq. 13}$$

For illustration, it is convenient to show continuous-time waveforms as in FIGS. 3 and 4. However, the energy packets are typically implemented (calculated and used) with the discrete-time approach as shown in Equations 12 and 13. Energy packets for multiple phases, such as three phases, may be calculated as a summation of Equation 12 over all three phases and a separate summation of Equation 13 over all three phases. Three-phase energy packets may be calculated, for each integration interval, as shown in Equations 14, 15, and 16:

$$\varepsilon_3^+[n] = \varepsilon_{a\text{-}phase}^+[n] + \varepsilon_{b\text{-}phase}^+[n] + \varepsilon_{c\text{-}phase}^+[n] \quad \text{Eq. 14}$$

$$\varepsilon_3^-[n] = \varepsilon_{a\text{-}phase}^-[n] + \varepsilon_{b\text{-}phase}^-[n] + \varepsilon_{c\text{-}phase}^-[n] \quad \text{Eq. 15}$$

$$\varepsilon_3[n] = \varepsilon_3^+[n] + \varepsilon_3^-[n] \quad \text{Eq. 16}$$

In various embodiments, the present time t (or $nT_S$) may be synchronized across all measuring devices using a time signal that is common among the measuring devices such as a global time signal (GNSS) or the like. Each energy packet across the power system may correspond to a common synchronous time value.

Energy packets measure energy exchanges. This enables a new and more precise electric power market approach. To achieve this market application, the energy packet computation may be incremented by step-sizes equal to a fixed summation window length as illustrated in Equations 17 and 18. These equations explain mathematically the downsampling relationships. In an implementation, it is possible to compute Equations 10-16 only for the selected summation window. There is no need to compute the summations not used in Equations 17 and 18. This is implementation simplification is shown in FIG. 5.

$$\varepsilon_M^+[k] = \varepsilon^+[n]|_{n=kM, k \in JJ} \quad \text{Eq. 17}$$

$$\varepsilon_M^-[k] = \varepsilon^-[n]|_{n=kM, k \in JJ} \quad \text{Eq. 18}$$

Figure 5:
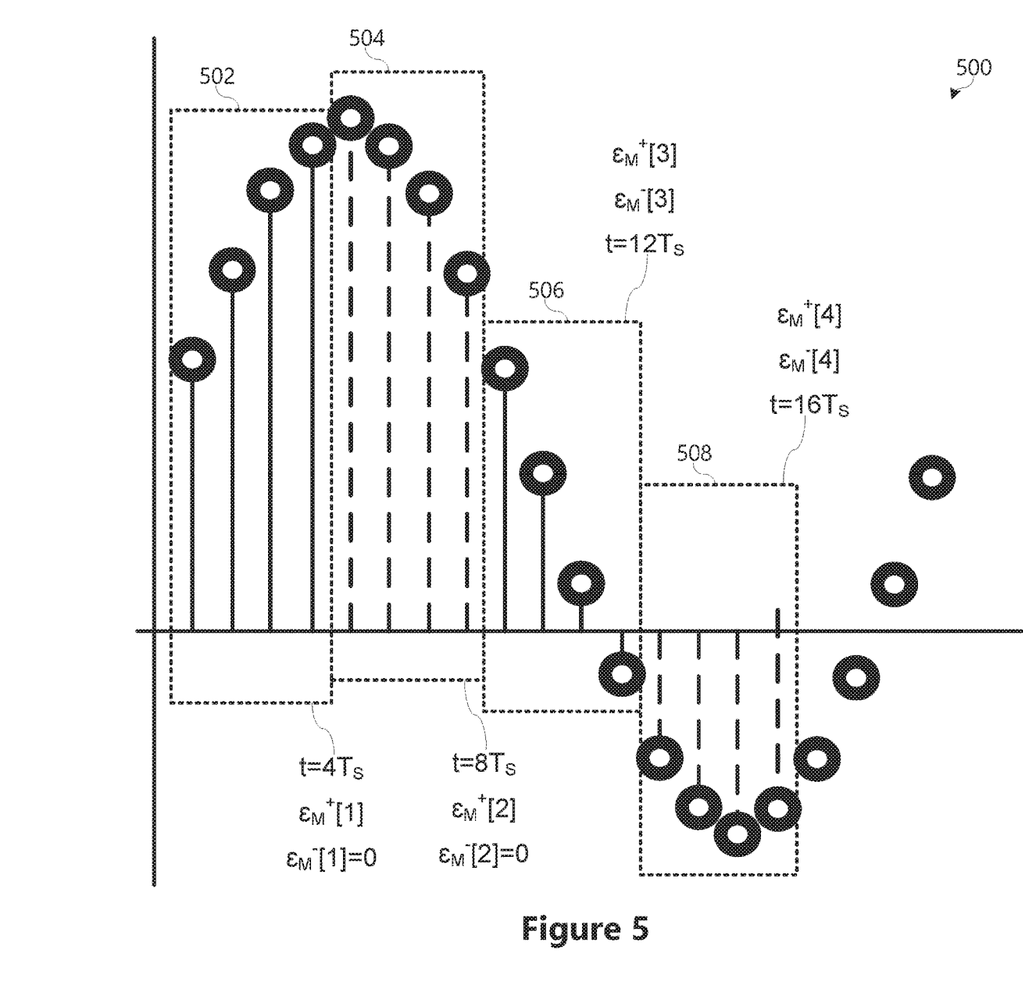
FIG. 5 illustrates energy packet calculation over time.

FIG. 5 illustrates Equations 17 and 18. In this example, M=4. The first four points are included in the first energy packet 502 (positive portion of energy packet $\varepsilon_M^+[1]$ and negative portion of energy packet $\varepsilon_M^-[1]$) at time $t=4T_S$. These shown with solid vertical lines. The next four points are included in the second energy packet 504 (positive portion of energy packet $\varepsilon_M^+[2]$ and negative portion of energy packet $\varepsilon_M^-[2]$) at time $t=8T_S$, with dashed lines. In the first two energy packets 502, 504, no energy moves in the negative direction (negative portions of energy packets $\varepsilon_M^-[1]$ and $\varepsilon_M^-[2]$ are each zero). The third energy packet 506 includes both positive and negative moving energy and is shown again with solid vertical lines. The energy for the third packet 506 is time-stamped with $t=12T_S$. Finally, the fourth energy packet 508 for this example includes all negative direction moving energy.

The mathematically equivalent representation of Equations 10, 11, 12, and 13, simultaneously including the downsampling operation of Equations 17 and 18 in one step is given by the following equations. For notational simplicity, the subscript, M, is dropped in Equation 19 through Equation 25. For the following portion of this disclosure, all energy packets are computed and used after downsampling.

$$\varepsilon[k] = MT_s \sum_{m=M(k-1)+1}^{Mk} v[m]i[m] \quad \text{Eq. 19}$$

$$\varepsilon_3[k] = MT_s \sum_{m=M(k-1)+1}^{Mk} v_{a\text{-}phase}[m]i_{a\text{-}phase}[m] + \quad \text{Eq. 20}$$
$$v_{b\text{-}phase}[m]i_{b\text{-}phase}[m] + v_{c\text{-}phase}[m]i_{c\text{-}phase}[m]$$

$$\varepsilon^+[k] = MT_s \sum_{m=M(k-1)+1}^{Mk} \begin{cases} v[m]i[m] & \text{if: } v[m]i[m] \geq 0 \\ 0 & \text{otherwise} \end{cases} \quad \text{Eq. 21}$$

$$\varepsilon^-[k] = MT_s \sum_{m=M(k-1)+1}^{Mk} \begin{cases} v[m]i[m] & \text{if: } v[m]i[m] < 0 \\ 0 & \text{otherwise} \end{cases} \quad \text{Eq. 22}$$

Similarly, the three-phase is calculated based on the downsampled values.

$$\varepsilon_3^+[k] = \varepsilon_{a\text{-}phase}^+[k] + \varepsilon_{b\text{-}phase}^+[k] + \varepsilon_{c\text{-}phase}^+[k] \quad \text{Eq. 23}$$

$$\varepsilon_3^-[k] = \varepsilon_{a\text{-}phase}^-[k] + \varepsilon_{b\text{-}phase}^-[k] + \varepsilon_{c\text{-}phase}^-[k] \quad \text{Eq. 24}$$

$$\varepsilon_3[k] = \varepsilon_3^+[k] + \varepsilon_3^-[k] \quad \text{Eq. 25}$$

In certain embodiments, Equations 17 and 18 may be calculated per phase with Equations 12 and 13. In other embodiments, Equations 17 and 18 may be calculated for all three phases with Equations 14 and 15.

Energy packets may be used to determine an amount of energy passing through a point. As such, energy packets may be used in the compensation of energy producers and billing of energy consumers. Energy for compensation of an energy producer may be denominated with the subscript (p) to indicate producer. The energy that a producer transmits into the system may be calculated according to Equation 26, where (p) indicates "price" not "power".

$$p_{(p)}^+[k] = v_{(p)}^+[k]\varepsilon_M^+[k] \quad \text{Eq. 26}$$

An energy producer may also be compensated for the energy they receive from the system. The absolute value of the negative direction energy packet may be calculated as illustrated in Equation 27. This ensures that the sign of the monetary rate, $v_{(p)}^-$, properly determines a credit or debit situation, as illustrated in Equation 27:

$$p_{(p)}^-[k] = v_{(p)}^-[k]\varepsilon_M^-[k] \quad \text{Eq. 27}$$

where:
  $v_{(p)}^+$ is the monetary rate of transmitted energy at the generation station, with units of monetary value (for example, U.S. dollars) per joule.

$v_{(p)}^-$ is the monetary rate of received energy at the generation station, with units of monetary value per joule.

$p_{(p)}^+$ is the price per energy packet of transmitted energy at the producer.

$p_{(p)}^-$ is the price per energy packet of received energy at the producer.

Income for the energy producer may be calculated as described in Equation 28, which is the sum of Equations 26 and 27:

$$p_{(p)}[k] = p_{(p)}^+[k] + p_{(p)}^-[k] \qquad \text{Eq. 28}$$

The total price is the sum of Equation 28 for all three phases. So, let Equation 28 be for a single phase, denote this with a subscript, and then sum Equation 28 three times, once for each phase, as illustrated in Equation 29:

$$p_{(p),3\text{-}phase}[k] = p_{(p),a\text{-}phase}[k] + p_{(p),b\text{-}phase}[k] + p_{(p),c\text{-}phase}[k] \qquad \text{Eq. 29}$$

Normally, the value of energy produced is higher than the value of the energy received (Equation 30):

$$|v_{(p)}^+[k]| > |v_{(p)}^-[k]| \qquad \text{Eq. 30}$$

Similarly, an energy to and from an energy consumer may be calculated using energy packets flowing through a point at the energy consumer. An energy consumer (c) may be compensated for the energy they transmit into the system as shown in Equation 31:

$$p_{(c)}^+[k] = v_{(c)}^+[k] \varepsilon_M^+[k] \qquad \text{Eq. 31}$$

An energy consumer may be billed for the energy they receive from the system in accordance with Equation 32:

$$p_{(c)}^-[k] = v_{(c)}^-[k] |\varepsilon_M^-[k]| \qquad \text{Eq. 32}$$

The net income for the energy consumer is shown in Equation 33, which is the sum of Equations 31 and 32. Almost always Equation 32 will be negative, indicating that the consumer must pay for each energy packet received:

$$p_{(c)}[k] = p_{(c)}^+[k] + p_{(c)}^-[k] \qquad \text{Eq. 33}$$

The consumer is interested in receiving energy from the electric grid. The consumer may also transfer energy to the electric grid for a variety of reasons. Passive reactive devices at the consumer location may send energy to the grid and this energy may have little value to the grid operators. This energy transfer is likely to be a bill to the consumer. However, the consumer may also send energy to the grid as a small energy producer, although the infrastructure over which that energy is transmitted represents a financial investment. Therefore, the value of energy consumed is typically higher than the value of the energy produced (Equation 34). This is opposite to the producer case in Equation 30.

$$|v_{(c)}^+[k]| < |v_{(c)}^-[k]| \qquad \text{Eq. 34}$$

The same basic equations apply to other equipment connected with the power system. The embodiments using energy packet as disclosed herein may be used to precisely measure the instantaneous energy transmitted to and from such equipment. This allows pricing based on the direction of energy flow. Also, because each energy packet is precisely time-stamped, the energy transmitted and received may be compared in a synchronized manner across the power system.

As described above, an IED may be used to meter electric power delivery systems, such as IED 210 of FIG. 2. The energy packet calculator 224 may be configured to calculate energy packets, such as discrete time energy packets illustrated and described above. The discrete time energy packets may be used in the value and price calculator to calculate a value (price to bill, or compensate), energy producers and consumers for all energy packets transmitted and received over a billing period. IED 210 may further maintain a record in the storage media 114 of energy packets and/or value. The record may be transmitted to another IED, the consumer, the producer, a supervisory system (such as supervisory control and data acquisition (SCADA) system), an automatic meter reading (AMR) system, an electric utility, or the like. The record may be in the form of a report transmitted in accordance with a predetermined schedule. In certain embodiments, the calculated energy packets and/or value may be continuously transmitted (or streamed) to the consumer, producer, supervisory system, AMR system, electric utility, or the like.

Transmission of the report or the streaming values may be communicated via a network 180 or peer-to-peer using the communication interface 118. In various embodiments, the communication interface 118 may be a radio interface in communication with a radio receiver for receiving the report and/or streaming values. The communication interface 118 may provide the report upon interrogation. Energy packets, whether in a report or streaming, may include a time stamp of the energy packet, where the time stamp includes a time of energy packet capture as illustrated in FIG. 5. The time may be obtained using the common time interface 232. Accordingly, a plurality of IEDs may report and/or stream time-coordinated and time-stamped energy packets.

In various embodiments, the IED may include a human-machine interface (HMI) or other display capable of displaying energy packet information. The IED may be configured to display energy packets or a sum of energy packets for a predetermined or settable time period. For example, the IED may be configured to display the sum of energy packets over a period of 5 seconds, updating the display every second. The IED may be configured to display a sum of energy packets command (such as pressing a button, a touch-screen command, a wireless interrogation, or the like). The IED may be configured to display a sum of energy packets since the last display of the previous sum. The display may include the time period for the sum of energy packets. Accordingly, a technician may interrogate the IED to visually display the sum of energy packets since a previous read of the IED.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A device to calculate a value of energy passing through a point of an electric power delivery system, comprising:
   a stimulus interface for receiving electric power delivery system signals at the point and providing current and voltage measurements;
   an energy packet calculator in communication with the stimulus interface to calculate energy packets over predetermined time interval lengths entering the point and leaving the point by:
   calculating products of the current measurements and the voltage measurements obtained over a time interval of the predetermined time interval length;

calculating a time interval power as a sum of the calculated products of the current and voltage measurements over the time interval;

calculating an energy packet value for the time interval as a product of the time interval power, the time interval length, and the number of voltage and current measurements;

separating positive energy packet values from negative energy packet values, wherein the separation of positive energy packet values and negative energy packet values is determined by energy entering and leaving the point; and, a communications interface for transmitting the energy packet value to a receiving device.

2. The device of claim 1, further comprising a price calculator to determine a price for the energy packet value as a product of the energy packet value and a monetary rate.

3. The device of claim 1, wherein the energy packet value may be calculated as:

$$\varepsilon[k] = MT_s \sum_{m=M(k-1)+1}^{Mk} v[m]i[m]$$

where:
ε[k] represents the energy packet value at time n;
M represents the number of samples;
$T_s$ represents the sample time interval length;
v[m] represents the voltage measurement at time m; and,
i[m] represents the current measurement at time m.

4. The device of claim 1, wherein the energy packet value is a three-phase energy packet value.

5. The device of claim 4, wherein the three-phase energy packet value is calculated as:

$$\varepsilon_3[k] = MT_s \sum_{m=M(k-1)+1}^{Mk} v_{a\text{-}phase}[m]i_{a\text{-}phase}[m] + v_{b\text{-}phase}[m]i_{b\text{-}phase}[m] + v_{c\text{-}phase}[m]i_{c\text{-}phase}[m]$$

where:
$\varepsilon_3[n]$ represents the three-phase energy packet value at time n;
M represents the number of samples;
$T_s$ represents the sample time interval length;
$v_{a\text{-}phase}[m]$ represents the A-phase voltage measurement at time m;
$i_{a\text{-}phase}[m]$ represents the A-phase current measurement at time m;
$v_{b\text{-}phase}[m]$ represents the A-phase voltage measurement at time m;
$i_{b\text{-}phase}[m]$ represents the A-phase current measurement at time m;
$v_{c\text{-}phase}[m]$ represents the A-phase voltage measurement at time m; and,
$i_{c\text{-}phase}[m]$ represents the A-phase current measurement at time m.

6. The device of claim 1, wherein the positive and negative energy packet values are calculated as:

$$\varepsilon^+[k] = MT_s \sum_{m=M(k-1)+1}^{Mk} \begin{cases} v[m]i[m] & \text{if: } v[m]i[m] \geq 0 \\ 0 & \text{otherwise} \end{cases}$$

$$\varepsilon^-[k] = MT_s \sum_{m=M(k-1)+1}^{Mk} \begin{cases} v[m]i[m] & \text{if: } v[m]i[m] < 0 \\ 0 & \text{otherwise} \end{cases}$$

where:
$\varepsilon^+[k]$ represents the positive energy packet value at time n;
$\varepsilon^-[k]$ represents the negative energy packet value at time n;
M represents the number of samples;
$T_s$ represents the sample time interval length;
v[m] represents the voltage measurement at time m; and,
i[m] represents the current measurement at time m.

7. The device of claim 6, wherein the positive and negative energy packet values are three-phase positive and negative energy packet values calculated as:

$$\varepsilon_3^+[k] = \varepsilon_{a\text{-}phase}^+[k] + \varepsilon_{b\text{-}phase}^+[k] + \varepsilon_{c\text{-}phase}^+[k]$$

$$\varepsilon_3^-[k] = \varepsilon_{a\text{-}phase}^-[k] + \varepsilon_{b\text{-}phase}^-[k] + \varepsilon_{c\text{-}phase}^-[k]$$

where:
$\varepsilon_{a\text{-}phase}^+[k]$ represents the A-phase positive energy packet value;
$\varepsilon_{b\text{-}phase}^+[k]$ represents the B-phase positive energy packet value;
$\varepsilon_{c\text{-}phase}^+[k]$ represents the C-phase positive energy packet value;
$\varepsilon_{a\text{-}phase}^-[k]$ represents the A-phase negative energy packet value;
$\varepsilon_{b\text{-}phase}^-[k]$ represents the B-phase negative energy packet value; and,
$\varepsilon_{c\text{-}phase}^-[k]$ represents the C-phase negative energy packet value.

8. The device of claim 6, wherein the positive energy packet value represents a value of energy leaving the point, and the negative energy packet value represents a value of energy entering the point.

9. The device of claim 1, wherein the stimulus input is in communication with instrument transformers to receive analog signals related to voltage and current on the electric power delivery system.

10. The device of claim 1, wherein the stimulus input is in communication with a merging unit to receive digitized analog signals related to voltage and current on the electric power delivery system.

11. The device of claim 1, wherein the energy packet value is associated with a time stamp.

12. The device of claim 11, wherein the time stamp is generated using a common time signal.

13. The device of claim 12, wherein the communications interface is further configured to transmit the energy packet value with its associated time stamp to the receiving device for time alignment of energy packets.

14. A system of devices to calculate values of energy passing through points of an electric power delivery system, each device comprising:
a stimulus interface for receiving electric power delivery system signals at the point and providing current and voltage measurements;
an energy packet calculator in communication with the stimulus interface to calculate energy packets over predetermined time interval lengths entering the point and leaving the point by:

calculating products of the current measurements and the voltage measurements obtained over a time interval of the predetermined time interval length;

calculating a time interval power as a sum of the calculated products of the current and voltage measurements over the time interval;

calculating an energy packet value for the time interval as a product of the time interval power, the time interval length, and the number of voltage and current measurements;

separating positive energy packet values from negative energy packet values, wherein the separation of positive energy packet values and negative energy packet values is determined by energy entering and leaving the point; and, a communications interface for transmitting the energy packet value to a receiving device, wherein each device of the system of devices is configured to calculate the values of energy at each point in a time-coordinated fashion using a common time signal.

15. The system of devices of claim 14, wherein the energy packet values are associated with a time stamp.

16. The system of devices of claim 15, wherein the energy packet values and time stamps are transmitted to a supervisory system.

17. A method of calculating values of energy passing through a point of an electric power delivery system, comprising the steps of:

obtaining electric power system voltage and current measurements associated with the point;

calculating products of the current measurements and the voltage measurements obtained over a time interval of a predetermined time interval length;

calculating a time interval power as a sum of the calculated products of the current and voltage measurements over the time interval;

calculating an energy packet value for the time interval as a product of the time interval power, the time interval length, and the number of voltage and current measurements;

separating positive energy packet values from negative energy packet values, wherein the separation of positive energy packet values and negative energy packet values is determined by energy entering and leaving the point; and, transmitting the energy packet value to a receiving device.

18. The method of claim 17, wherein the current and voltage measurements comprise three-phase current and voltage measurements; and, the energy packet value comprises a three-phase energy packet value.

19. The method of claim 18, wherein the positive energy packet value represents energy leaving the point and the negative energy packet value represents energy entering the point.

20. A device to calculate a value of energy passing through a point of an electric power delivery system, comprising:

a stimulus interface for receiving electric power delivery system signals at the point and providing current and voltage measurements;

an energy packet calculator in communication with the stimulus interface to calculate energy packets over predetermined time interval lengths entering the point and leaving the point by:

calculating products of the current measurements and the voltage measurements obtained over a time interval of the predetermined time interval length;

calculating a time interval power as a sum of the calculated products of the current and voltage measurements over the time interval;

calculating an energy packet value for the time interval as a product of the time interval power, the time interval length, and the number of voltage and current measurements;

associating the energy packet value with a time stamp corresponding with a time from a common time reference; and, a communications interface for transmitting the energy packet value and associated time stamp to a receiving device.

* * * * *